US008273815B2

(12) United States Patent
Morita et al.

(10) Patent No.: US 8,273,815 B2
(45) Date of Patent: Sep. 25, 2012

(54) CURABLE SILICONE COMPOSITION AND ELECTRONIC COMPONENT

(75) Inventors: Yoshitsugu Morita, Chiba (JP); Minoru Isshiki, Chiba (JP); Tomoko Kato, Chiba (JP)

(73) Assignee: Dow Corning Toray Company, Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 12/440,824

(22) PCT Filed: Aug. 23, 2007

(86) PCT No.: PCT/JP2007/066829
§ 371 (c)(1),
(2), (4) Date: Dec. 16, 2009

(87) PCT Pub. No.: WO2008/032575
PCT Pub. Date: Mar. 20, 2008

(65) Prior Publication Data
US 2010/0113667 A1 May 6, 2010

(30) Foreign Application Priority Data
Sep. 11, 2006 (JP) ................. 2006-246080

(51) Int. Cl.
C08L 83/04 (2006.01)
C08K 3/38 (2006.01)
C08K 3/14 (2006.01)
C08K 3/22 (2006.01)
C08K 3/08 (2006.01)
C08K 3/34 (2006.01)
C08K 3/28 (2006.01)

(52) U.S. Cl. ........ 524/404; 524/424; 524/428; 524/430; 524/432; 524/440; 524/443; 524/588

(58) Field of Classification Search ..................... 528/10
See application file for complete search history.

(56) References Cited

U.S. PATENT DOCUMENTS

| 3,168,405 A | 2/1965 | Martin et al. |
| 3,410,820 A | 11/1968 | Harrod |
| 5,021,494 A | 6/1991 | Toya |
| 5,143,951 A * | 9/1992 | Ohta et al. ................... 523/435 |
| 5,206,312 A | 4/1993 | Liao et al. |

(Continued)

FOREIGN PATENT DOCUMENTS

EP 282977 A2 9/1988

(Continued)

OTHER PUBLICATIONS

English language translation and abstract for JP 05295084 extracted from PAJ database dated Jul. 6, 2009, 56 pages.

(Continued)

*Primary Examiner* — Robert S Loewe
(74) *Attorney, Agent, or Firm* — Howard & Howard Attorneys PLLC

(57) ABSTRACT

A curable silicone composition comprising at least the following components: (A) an epoxy-containing organopolysiloxane; (B) a curing agent for an epoxy resin; (C) a thermally conductive metal powder; and (D) a thermally conductive nonmetal powder; exhibits low viscosity, excellent handleability and curability and, when cured, forms a cured body of flexibility, low specific gravity, and excellent thermal conductivity. An electronic component sealed or adhesively bonded with use of a cured body obtained by curing the aforementioned composition provides high reliability.

11 Claims, 1 Drawing Sheet

U.S. PATENT DOCUMENTS

| | | | | |
|---|---|---|---|---|
| 5,283,309 | A * | 2/1994 | Morita | 528/27 |
| 5,290,883 | A * | 3/1994 | Hosokawa et al. | 525/423 |
| 5,319,005 | A | 6/1994 | Hagiwara et al. | |
| 5,344,905 | A | 9/1994 | Morita | |
| 5,358,983 | A * | 10/1994 | Morita | 523/455 |
| 5,512,640 | A | 4/1996 | Osawa et al. | |
| 5,516,858 | A | 5/1996 | Morita et al. | |
| 5,530,075 | A | 6/1996 | Morita et al. | |
| 5,575,956 | A * | 11/1996 | Hermansen et al. | 252/514 |
| 5,618,631 | A | 4/1997 | Meguriya et al. | |
| 5,623,026 | A | 4/1997 | Buekers et al. | |
| 5,645,941 | A | 7/1997 | Meguriya et al. | |
| 5,714,265 | A | 2/1998 | Meguriya et al. | |
| 5,859,127 | A | 1/1999 | Nakano et al. | |
| 5,952,439 | A | 9/1999 | Morita et al. | |
| 5,998,509 | A * | 12/1999 | Hayase et al. | 523/425 |
| 6,117,953 | A | 9/2000 | Ichiroku et al. | |
| 6,235,862 | B1 | 5/2001 | Isshiki et al. | |
| 6,248,454 | B1 * | 6/2001 | Ikemura | 428/620 |
| 6,512,031 | B1 | 1/2003 | Honda et al. | |
| 7,138,467 | B2 | 11/2006 | Furukawa et al. | |
| 7,994,246 | B2 | 8/2011 | Morita et al. | |
| 8,119,744 | B2 | 2/2012 | Morita et al. | |
| 2002/0015748 | A1 | 2/2002 | Miyajima et al. | |
| 2002/0028335 | A1 | 3/2002 | Fujiki et al. | |
| 2003/0010962 | A1 | 1/2003 | Kuwabara et al. | |
| 2003/0071366 | A1 | 4/2003 | Rubinsztajn et al. | |
| 2003/0207123 | A1 | 11/2003 | Brunelle et al. | |
| 2003/0212230 | A1 | 11/2003 | Rubinsztajn et al. | |
| 2004/0198925 | A1 | 10/2004 | Morita et al. | |
| 2004/0242762 | A1 * | 12/2004 | Horikoshi et al. | 524/588 |
| 2005/0037537 | A1 | 2/2005 | Kim et al. | |
| 2005/0080204 | A1 | 4/2005 | Furukawa et al. | |
| 2005/0129957 | A1 | 6/2005 | Kashiwagi et al. | |
| 2005/0159577 | A1 | 7/2005 | Davis et al. | |
| 2005/0222298 | A1 | 10/2005 | Rubinsztajn et al. | |
| 2005/0267286 | A1 | 12/2005 | Nakamura et al. | |
| 2006/0038304 | A1 | 2/2006 | Osako et al. | |
| 2009/0203837 | A1 | 8/2009 | Morita et al. | |
| 2010/0063185 | A1 | 3/2010 | Morita et al. | |
| 2010/0113667 | A1 | 5/2010 | Morita et al. | |
| 2010/0213623 | A1 | 8/2010 | Isshiki et al. | |

FOREIGN PATENT DOCUMENTS

| | | |
|---|---|---|
| EP | 0464706 A1 | 1/1992 |
| EP | 0543384 A1 | 5/1993 |
| EP | 0567079 A1 | 10/1993 |
| EP | 0571965 A1 | 12/1993 |
| EP | 0620242 A2 | 10/1994 |
| EP | 0647682 A1 | 4/1995 |
| EP | 0821038 A2 | 1/1998 |
| EP | 1002834 A1 | 5/2000 |
| EP | 1162239 A2 | 12/2001 |
| EP | 1319690 A2 | 6/2003 |
| GB | 2279616 A | 1/1995 |
| JP | 05105758 A | 4/1993 |
| JP | 05295084 A | 11/1993 |
| JP | 05320514 A | 12/1993 |
| JP | 06056999 A * | 3/1994 |
| JP | 06306084 A | 11/1994 |
| JP | 07022441 A | 1/1995 |
| JP | 07053870 A | 2/1995 |
| JP | 70118365 A | 5/1995 |
| JP | 07161740 | 6/1995 |
| JP | 08176447 | 7/1996 |
| JP | 08244064 A | 9/1996 |
| JP | 09095651 | 4/1997 |
| JP | 10130465 A | 5/1998 |
| JP | 10147764 A | 6/1998 |
| JP | 10163232 A | 6/1998 |
| JP | 11012546 | 1/1999 |
| JP | 11077733 A | 3/1999 |
| JP | 2000277551 A | 10/2000 |
| JP | 2002220486 A | 8/2002 |
| JP | 2004043814 | 2/2004 |
| JP | 2004043815 | 2/2004 |
| JP | 2004296555 A | 10/2004 |
| JP | 2005154766 A | 6/2005 |
| JP | 2005183788 A | 7/2005 |
| JP | 2005268565 A | 9/2005 |
| JP | 2006306953 A | 11/2006 |
| JP | 2006306954 A | 11/2006 |
| WO | 02097393 A3 | 12/2002 |
| WO | WO 03072656 A1 | 9/2003 |
| WO | 2005021652 A1 | 3/2005 |
| WO | WO2005044920 A1 | 5/2005 |
| WO | 2005062368 A1 | 7/2005 |
| WO | 2006011676 A1 | 2/2006 |
| WO | 2006118335 A1 | 11/2006 |
| WO | WO 2006118334 A1 | 11/2006 |

OTHER PUBLICATIONS

English language translation and abstract for JP 05320514 extracted from PAJ database dated Jul. 6, 2009, 44 pages.

English language translation and abstract for JP 06056999 extracted from PAJ database dated Jul. 6, 2009, 71 pages.

English language translation and abstract for JP 06306084 extracted from PAJ database dated Jul. 21, 2009, 61 pages.

English language translation and abstract for JP 07053870 extracted from PAJ database dated Jul. 6, 2009, 51 pages.

English language translation and abstract for JP 07118365 extracted from PAJ database dated Jul. 21, 2009, 23 pages.

English language translation and abstract for JP 07022441 extracted from PAJ database dated Jul. 21, 2009, 21 pages.

English language translation and abstract for JP 10130465 extracted from PAJ database dated Jul. 21, 2009, 25 pages.

English language translation and abstract for JP 10147764 extracted from PAJ database dated Jul. 21, 2009, 23 pages.

English language translation and abstract for JP 10163232 extracted from PAJ database dated Jul. 21, 2009, 24 pages.

English language translation and abstract for JP 2005154766 extracted from PAJ database dated Jul. 6, 2009, 55 pages.

PCT International Search Report for PCT/JP2004/016716, dated Feb. 17, 2005, 2 pages.

PCT International Search Report for PCT JP2007/066829, dated Dec. 6, 2007, 4 pages.

English language translation and abstract for JP 11077733 extracted from PAJ database, dated May 29, 2008, 35 pages.

English language translation and abstract for JP 08244064 extracted from PAJ database, dated May 29, 2008, 41 pages.

English language translation and abstract for JP 2002-220486 extracted from PAJ database, dated Apr. 20, 2010, 14 pages.

English language abstract for JP 2000277551 extracted from espacenet.com database, dated Feb. 2, 2009.

English language translation and abstract for JP 2004296555 extracted from PAJ database, dated Feb. 2, 2009, 60 pages.

English language translation and abstract for JP 2005183788 extracted from PAJ database, dated Feb. 2, 2009, 69 pages.

English language translation and abstract for JP 2005268565 extracted from PAJ database, dated Feb. 2, 2009, 51 pages.

PCT International Search Report for PCT/JP2007/053131, dated May 29, 2007, 4 pages.

English language translation and abstract for JP 2006-306953 extracted from PAJ database, dated Nov. 6, 2009, 55 pages.

English language translation and abstract for JP 2006-306954 extracted from PAJ database, dated Nov. 6, 2009, 78 pages.

Shikhiev et al., "Synthesis and Reactions of Unsaturated Organosilicon Compounds", J. of General Chemistry of the USSR, vol. 41, No. 3, 1971, pp. 617-619.

English language translation and abstract for JP07-161740 extracted from Searching PAJ, Jan. 1, 2008, pp. 15.

PCT International Search Report for PCT/JP2007/074607, dated Mar. 28, 2008, 3 pages.

English language abstract for JP11-012546 extracted from esp@cenet.com, Dec. 16, 2007.

English language translation and abstract for JP2004-043814 extracted from Searching PAJ, Dec. 16, 2007, pp. 51.

PCT International Search Report for PCT/JP2005/024196, Mar. 8, 2006, 3 pages.

Shikhiev et al., "Synthesis and Reactions of Some Heteroorganic Ethers ...", J. of General Chemistry of the USSR, vol. 45, No. 1, 1975, pp. 91-93.

PCT International Search Report for PCT/JP2006/306996, Jul. 7, 2006, 3 pages.

English language translation and abstract for JP08-176447 extracted from Searching PAJ, Dec. 9, 2007, pp. 28.

English language translation and abstract for JP09-095651 extracted from Searching PAJ, Feb. 23, 2012, pp. 17.

PCT International Search Report for PCT/JP2005/018405, Mar. 6, 2006, 6 pages.

English language translation and abstract for JP2004-043815 extracted from Searching PAJ, Dec. 9, 2007, pp. 21.

English language translation and abstract for JP 05-105758 extracted from Searching PAJ database, Nov. 10, 2009, pp. 43.

PCT International Search Report for PCT/JP2007/074606, dated Mar. 25, 2008, 3 pages.

Boons et al., "Use of (Phenyldimethylsilyl)methoxymethyl and (Phenyldimethylsilyl) methyl ethers ...", Tetrahedron Letters, vol. 31, No. 15, 1990, pp. 2197-2200.

Schultz et al., "The Synthesis of Trimethylsilylmethoxymethyl Chloride", OPPI Briefs, vol. 27, No. 5, 1995, pp. 572-574.

Hojo et al., "New Access to Carbonyl Ylides by the Silicon-Based 1,3-Elimination and Their ...", Tetrahedron Letters, vol. 34, No. 37, 1993, pp. 5943-5946.

Yongxin Han et al. "Silicon Directed ipso-Substitution of Polymer Bound Arylsilanes: Preparation of Biaryls via", Tetrahedron Letters, vol. 37, No. 16. 1996, pp. 2703-2706.

Miramon et al., "Short Synthesis of Polyoxygenated Macrocyclic ...", Journal of Organic Chemistry, vol. 69, No. 20, 2004, pp. 6949-6952.

PCT International Search Report for PCT/JP2006/309218, Jul. 14, 2006, 4 pages.

PCT International Search Report for PCT/JP2005/011864, Nov. 10, 2005, 5 pages.

Guedin-Vuong et al., "An Easy Access to Homopropargylic Ethers", Bulletin De La Societe Chimique De France, No. 2, 1986, pp. 245-252.

Pyne et al., "Chiral and Stereochemical Control via Intramolecular Diels-Alder Reaction of Z Dienes", J. American Chemical Society, vol. 104, No. 21, 1982, pp. 5719-5728.

Lipshutz et al., "B-(Trimethylylsilyl) Ethoxymethyl Chloride ...," Tetrahedron Letters, vol. 21, No. 35, 1980, pp. 3343-3346.

Shipov et al., "Synthesis of Alkyl Chloromethyl Ethers", J. of General Chemistry of the USSR, vol. 59, No. 5.2, 1989, p. 1067.

Hasseberg et al., "104. Synthese von Orellin", Helvetica Chimica Acta—vol. 71, No. 5, 1988, pp. 957-963.

* cited by examiner

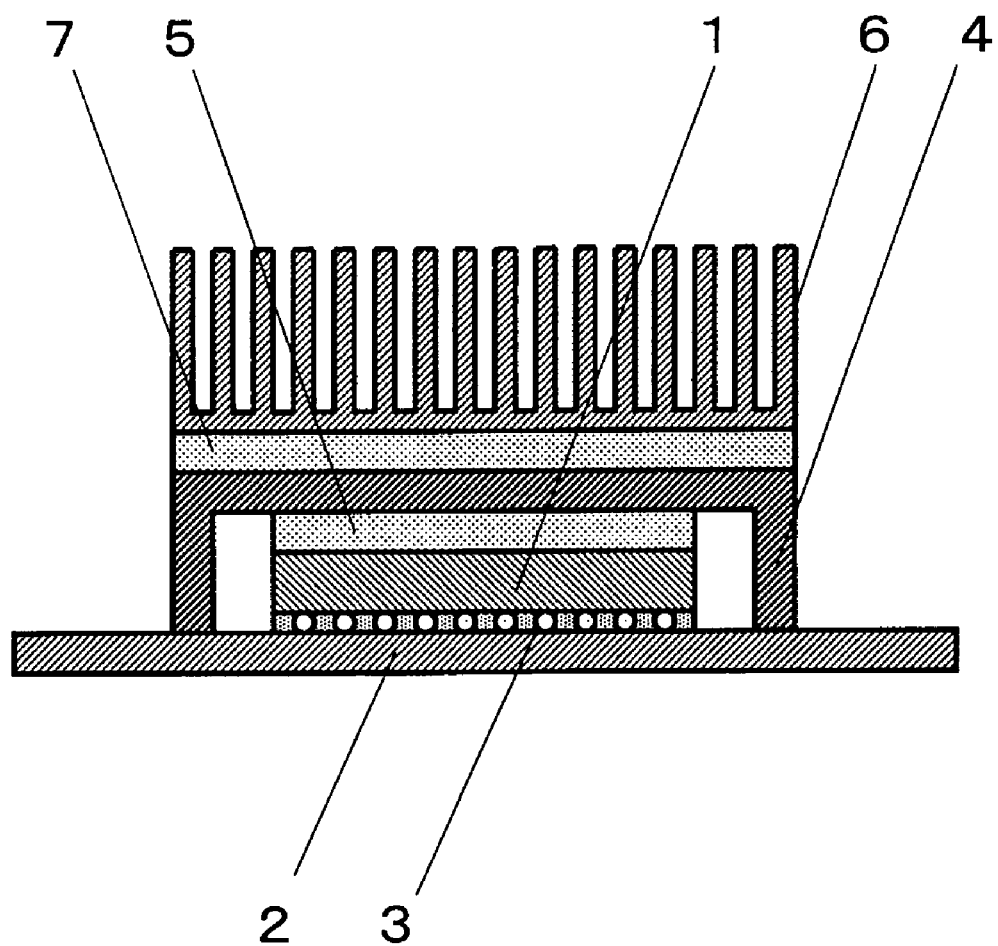

CURABLE SILICONE COMPOSITION AND ELECTRONIC COMPONENT

RELATED APPLICATIONS

This application claims priority to and all the advantages of International Patent Application No. PCT/JP2007/066829, filed on Aug. 23, 2007, which claims priority to Japanese Patent Application No. JP2006-246080, filed on Sep. 11, 2006.

TECHNICAL FIELD

The present invention relates to a curable silicone composition and to an electronic component. More specifically, the invention relates to a curable silicone composition that, along with low viscosity, exhibits excellent handleability and curability and that, when cured, forms a cured body that, along with excellent flexibility and low specific gravity, possesses high thermal conductivity. The invention also relates to an electronic component that is sealed or adhesively bonded with use of a cured body of the aforementioned composition and that provides excellent reliability.

BACKGROUND ART

It has been proposed to use a curable epoxy resin composition that contains a thermally conductive powder as a sealing or adhesive agent capable of efficiently transmitting heat generated by electronic components. However, since a cured body of such a composition has a high modulus of elasticity and is rigid, it was proposed to add an epoxy-containing organopolysiloxane (see Japanese Unexamined Patent Application Publication (hereinafter referred to as "Kokai") H05-295084).

However, a curable epoxy resin composition that includes an epoxy-containing organopolysiloxane is still too rigid and does not provide the required stress reduction. Therefore, use of such a composition in conjunction with electronic components is limited because it causes warping of the electronic components and cracking of a cured body of the composition, whereby gaps may occur between the cured body of the composition and the electronic component.

It has been proposed to solve the above problem by preparing curable silicone compositions comprising epoxy-containing organopolysiloxanes and curing agents (see Kokai H05-320514, Kokai H07-53870 and Kokai 2005-154766). In order to form cured bodies with high thermal conductivity properties, such compositions normally contain a large amount of a thermally conductive metal powder, in particular, a silver powder. This increased the cost and specific gravity. On the other hand, in order to obtain a thermally conductive cured body and to reduce the production cost, it is possible to combine the composition with a thermally conductive non-metal powder, a typical representative of which is alumina. However, the addition of alumina makes the composition too viscous and impairs handleability of the composition.

It is an object of the present invention to provide a curable silicone composition that, along with low viscosity, exhibits excellent industrial handleability and curability and that, when cured, forms a cured body that, along with flexibility and low specific gravity, possesses excellent thermal conductivity. It is another object to provide an electronic component that is sealed or adhesively bonded by means of a cured body of the aforementioned composition and that acquires high reliability.

DISCLOSURE OF INVENTION

A curable silicone composition of the present invention is characterized by comprising at least the following components: (A) an epoxy-containing organopolysiloxane; (B) a curing agent for an epoxy resin; (C) a thermally conductive metal powder; and (D) a thermally conductive nonmetal powder. And an electronic component of the invention is characterized by being sealed or adhesively bonded with use of a cured body obtained by curing the aforementioned curable silicone composition.

EFFECTS OF INVENTION

A curable silicone composition of the invention exhibits low viscosity, and excellent handleability and curability, and when cured, forms a cured body of excellent flexibility, low specific gravity, and high thermal conductivity. Furthermore, since the curable composition of the invention possesses excellent curability, it allows shortening of heating time, curing at reduced temperatures, and decreasing of internal stress caused by thermal expansion. Moreover, since the electronic component of the invention is sealed or bonded with a cured body of the composition, it acquired high reliability.

BRIEF DESCRIPTION OF THE DRAWINGS

FIG. 1 is a sectional view of an LSI as an example of an electronic component of the present invention.

REFERENCE NUMERALS 1 semiconductor element
2 substrate
3 ball-grid array
4 heat spreader
5 thermal-transfer material
6 heat sink
7 thermal-transfer material

DETAILED DESCRIPTION OF THE INVENTION

Let us first consider in details a curable silicone composition of the invention.

The epoxy-containing organopolysiloxane that constitutes component (A) is one of the main components of the composition. There are no special restrictions with regard to this component, provided that it contains in one molecule at least one epoxy group. However, it is preferable to use component (A) that comprises ($A_1$) an epoxy-containing organopolysiloxane represented by the following average unit formula:

$$R^1{}_3SiO_{1/2})_a(R^2{}_2SiO_{2/2})_b(R^3SiO_{3/2})_c$$

and/or ($A_2$) an epoxy-containing organopolysiloxane represented by the following general formula:

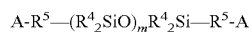
$$A-R^5-(R^4{}_2SiO)_m R^4{}_2Si-R^5-A$$

In the above formula of constituent ($A_1$), $R^1$, $R^2$, and $R^3$ are the same or different and comprise optionally substituted monovalent hydrocarbon groups or epoxy-containing monovalent organic groups. The monovalent hydrocarbon groups can be exemplified by methyl, ethyl, propyl, butyl, pentyl, or similar alkyl groups; vinyl, allyl, butenyl, pentenyl, hexenyl, or similar alkenyl groups; phenyl, tolyl, xylyl, or similar aryl groups; benzyl, phenethyl, or similar aralkyl groups; and chloromethyl, 3,3,3-trifluoropropyl, or similar halogen-substituted alkyl groups. Of these groups, most preferable are alkyl and aryl groups, especially methyl and phenyl groups. The epoxy-containing monovalent organic groups can be exemplified by 2-glycidoxyethyl, 3-glycidoxypropyl, 4-glycidoxybutyl, or similar glycidoxyalkyl groups; 2-(3,4-epoxycyclohexyl)ethyl, 3-(3,4-epoxycyclohexyl)propyl, 2-(3,4-epoxy-3-methylcyclohexyl)-2-methylethyl, or similar epoxycycloalkylalkyl groups; and 4-oxiranylbutyl, 8-oxiranyloctyl, or similar oxiranylalkyl groups. Of these groups, most preferable are glycidoxyalkyl and epoxycycloalkylalkyl groups, especially 3-glycidoxypropyl and 2-(3,4-epoxycyclohexyl)ethyl groups. In the above formula, at least two of groups of one molecule designated by $R^1$, $R^2$, and $R^3$ are the aforementioned epoxy-containing monovalent organic groups.

In one molecule, at least 20 mole %, preferably at least 50 mole %, and even more preferably at least 80 mole %, of all groups represented by $R^3$ are aryl groups. If the content of aryl groups out of all groups represented by $R^3$ in one molecule is less than the recommended lower limit, this will either impair adhesion of the cured body obtained from the composition, or reduce mechanical properties of the cured body. It is preferable that the aforementioned aryl groups be phenyl groups.

Furthermore, in the above formula, "a", "b", and "c" are numbers which should satisfy the following conditions: $0 \leq a \leq 0.8$; $0 \leq b \leq 0.8$; $0.2 \leq c \leq 0.9$; and $a+b+c=1$. In the above formula, "a" is a number that shows the ratio of siloxane units of formula $R^1{}_3SiO_{1/2}$. If this component is composed only of siloxane units of formula $R^3SiO_{3/2}$, it becomes too viscous, and this will impair handleability of the obtained composition. Therefore, it is preferable to satisfy the following condition: $0<a \leq 0.8$, preferably $0.3 \leq a \leq 0.8$. In the above formula, "b" is a number that shows the ratio of siloxane units of formula $R^2{}_2SiO_{2/2}$. In order to impart to this component an appropriate molecular weight, prevent bleeding of this component to the surface of the obtained cured body, and to provide the cure body with excellent mechanical strength, the following condition should be satisfied: $0 \leq b \leq 0.6$. In the above formula, "c" is a number that shows the ratio of siloxane units of formula $R^3SiO_{3/2}$. In order to improve handleability of the composition, as well as improved adhesive properties, mechanical strength, and flexibility of the cured body, the following condition should be satisfied: $0.4 \leq c \leq 0.9$.

There are no special restrictions with regard to the amounts in which the epoxy-containing monovalent organic group can be contained in constituent $(A_1)$, but it is desirable that the epoxy equivalent (which is a number obtained by dividing the mass-average molecular weight of this component by the number of epoxy groups in one molecule) of the aforementioned component be in the range of 100 to 2,000, preferably 100 to 1,000, and most preferably 100 to 700. If the epoxy equivalent is below the recommended lower limit, this will impair flexibility of the obtained cured body, and if the epoxy equivalent exceeds the recommended upper limit, this will reduce either curability of the obtained composition or mechanical strength of the cured body. Furthermore, constituent $(A_1)$ may comprise an organopolysiloxane of one type or a mixture of organopolysiloxanes of two or more types. There are no restrictions with regard to the state at 25° C., and the organopolysiloxanes may be, e.g., in a liquid or in a solid state. When constituent $(A_1)$ is in a solid state, it can be used with an organic solvent or it can be heated and uniformly mixed with another component. In order to provide good miscibility with another component and to facilitate handleability, it is recommended to use constituent $(A_1)$ in a liquid state. Also, there are no restrictions with regard to the mass average molecular weight of constituent $(A_1)$, but it is recommended that this characteristic be in the range of 500 to 10,000, preferably 750 to 3,000.

Examples of the organopolysiloxanes that can be used as constituent $(A_1)$ are given below by way of chemical formulas, wherein "a", "b", and "c" are the same as defined above. However, both "a" and "b" are numbers which are not equal to zero, and "c'" and "c''" are numbers which should satisfy the following conditions: $0.1<c'<0.8$; $0<c''<0.2$; $0.2 \leq (c'+c'') \leq 0.9$; $0.2 \leq c'/(c'+c'')$; "G" designates a 3-glycidoxypropyl group, and "E" designates a 2-(3,4-epoxycyclohexyl)ethyl group.

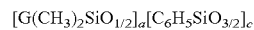

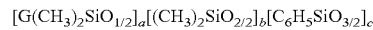

[E(CH₃)₂SiO₁/₂]ₐ[(CH₃)₂SiO₂/₂]ᵦ[C₆H₅SiO₃/₂]_c

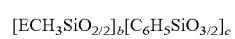

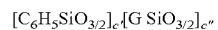

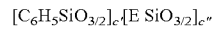

There are no special restrictions with regard to the method of manufacturing constituent $(A_1)$. For example, this constituent can be prepared according to the following methods:

by subjecting a phenyltrialkoxysilane and an alkoxysilane having epoxy-containing monovalent organic groups, e.g., 3-glycidoxypropyltrimethoxysilane or 2-(3,4-epoxycyclohexyl)ethyltrimethoxysilane, to co-hydrolysis and condensation;

by subjecting the aforementioned alkoxysilane having epoxy-containing monovalent organic groups and a silanol-containing organopolysiloxane, which is obtained by subjecting phenyltrichlorosilane or phenyltrialkoxysilane to hydrolysis and condensation, to a dealcoholation condensation reaction;

by subjecting phenyltrichlorosilane or phenyltrialkoxysilane to co-hydrolysis and condensation in the presence of silanes that contain dimethylchlorosilane or a similar silane having silicon-bonded hydrogen atoms and then subjecting the obtained organopolysiloxane that has silicon-bonded hydrogen atoms and an olefin having epoxy-containing monovalent organic groups to a hydrosilylation reaction;

by subjecting an organopolysiloxane obtained by subjecting phenyltrichlorosilane or phenyltrialkoxysilane to hydrolysis and condensation and a copolymer of dimethylsiloxane and methyl (3-glycidoxypropyl) siloxane capped at both molecular terminals with trimethylsiloxy groups, or a copolymer of dimethylsiloxane and methyl {2-(3,4-epoxycyclohexyl)ethyl} siloxane capped at both molecular terminals with trimethylsiloxy groups, to an equilibrium reaction in the presence of a basic catalyst;

by subjecting an organopolysiloxane composed of siloxane units represented by formula: $C_6H_5SiO_{3/2}$ and a cyclic methyl (3-glycidoxypropyl) siloxane, or a cyclic methyl {2-(3,4-epoxycyclohexyl)ethyl} siloxane, to an equilibrium reaction in the presence of a basic catalyst; or by subjecting an organopolysiloxane composed of siloxane units represented by formula: $C_6H_5SiO_{3/2}$ and a cyclic methyl (3-glycidoxypropyl) siloxane or a cyclic methyl {2-(3,4-epoxycyclohexyl)ethyl} siloxane and a cyclic dimethylsiloxane to an equilibrium reaction in the presence of an acidic or basic catalyst.

Furthermore, in the formula of component $(A_2)$, $R^4$ represents an optionally substituted monovalent hydrocarbon group that is free of unsaturated aliphatic bonds. Specific examples of such groups are the following: methyl, ethyl, propyl, butyl, pentyl, hexyl, or similar alkyl groups; cyclopentyl, cyclohexyl, cycloheptyl, or similar cycloalkyl groups; phenyl, tolyl, xylyl, or similar aryl groups; benzyl, phenethyl, phenylpropyl, or similar aralkyl groups; 3-chloropropyl, 3,3,3-trifluoropropyl, or similar halogenated alkyl groups. Most preferable of the above groups are alkyl groups, especially methyl groups. Furthermore, $R^5$ in the above formula is a bivalent organic group represented by ethylene, methylethylene, propylene, butylene, pentylene, hexylene, or similar alkylene groups; ethyleneoxyethylene, ethyleneoxypropylene, ethyleneoxybutylene, propyleneoxypropylene, or similar alkyleneoxyalkylene groups. Most preferable of these groups are alkylene groups, in particular, ethylene groups. In the above formula, "m" is an integer equal to or greater than 1 and represents the degree of polymerization of the organopolysiloxane in the main molecular chain. There are no special restrictions with regard to the value of "m", but it is recommended that "m" be an integer that does not exceed 500.

In the Above Formula:

$$A-R^5—(R^4{}_2SiO)_m R^4{}_2Si—R^5-A$$

"A" is an organopolysiloxane residue represented by the following average unit formula:

$$(XR^4{}_2SiO_{1/2})_d(SiO_{4/2})_e,$$

where $R^4$ represents an optionally substituted monovalent hydrocarbon group that is free of unsaturated aliphatic bonds; $R^4$ is represented by the same groups that have been shown above, of which most preferable are alkyl groups, in particular, methyl groups. In the aforementioned formula, X designates a single bond, a hydrogen atom, a group represented by $R^4$, an epoxy-containing monovalent organic group, or an alkoxysilylalkyl group. These groups represented by $R^4$ can be exemplified by the same groups as above. The epoxy-containing monovalent organic group may be the same as the epoxy-containing monovalent organic group exemplified above for $R^1$, $R^2$, and $R^3$. The alkoxysilylalkyl group can be exemplified by trimethoxysilylethyl, trimethoxysilylpropyl, dimethoxymethylsilylpropyl, methoxydimethylsilylpropyl, triethoxysilylethyl, or tripropoxysilylpropyl. However, in one molecule at least one X should be a single bond, and this bond is used in the aforementioned diorganopolysiloxane for bonding $R^5$. Furthermore, at least one X in one molecule is an epoxy-containing monovalent organic group, preferably a glycidoxyalkyl group, and most preferably a 3-glycidoxypropyl group. In the above formula, "d" is a positive number, "e" is a positive number, and "d/e" is a positive number in the range of 0.2 to 4.

There are no special restrictions with regard to the molecular weight of component $(A_2)$, but it is recommended that the mass average molecular weight range from 500 to 1,000,000. Also, there are no restrictions with regard to the state of component $(A_2)$ at 25° C., but the liquid state is preferable. It is recommended that the viscosity of component $(A_2)$ at 25° C. range from 50 to 1,000,000 mPa·s. This component can be prepared, e.g., by a method described in Kokai H06-56999.

In the composition of the invention, component (A) may comprise either aforementioned constituent $(A_1)$ or $(A_2)$ separately or in a mixture, but it is recommended to use at least constituent $(A_2)$. More specifically, component (A) may be represented by constituent $(A_2)$ alone or in a mixture of $(A_1)$ and $(A_2)$. When component (A) is a mixture of $(A_1)$ and $(A_2)$, there are no special restrictions with regard to the amount in which constituent $(A_2)$ can be used, but it is recommended to add this constituent in an amount of 0.1 to 800 parts by mass, preferably 1 to 500 parts by mass, and most preferably 10 to 200 parts by mass per 100 parts by mass of constituent $(A_1)$. If constituent $(A_2)$ is used in an amount less than the recommended lower limit, this will impair flexibility of the cured body obtained from the composition. If constituent $(A_2)$ is used in an amount exceeding the recommended upper limit, this will make the composition too viscous.

A curing agent used for interaction with epoxy resin and constitutes component (B) reacts with epoxy groups of component (A) and causes curing of the composition. Component (B) should preferably comprise a compound that contains in one molecule two or more functional groups that react with epoxy groups. The aforementioned functional groups are exemplified by the following groups: primary amine, secondary amine, hydroxyl, phenolic hydroxyl, carboxylic acid, acid anhydride, mercapto, or silanol groups. From the viewpoint of better reactivity and longer pot life, the phenolic hydroxyl group is preferable. More specifically, component (B) may comprise a compound that contains a phenolic hydroxyl group. Examples of such compounds are the following: phenol novolak resin, cresol novolak resin, bisphenol A-type compound, or a similar phenol-type resin; and an organopolysiloxane having phenolic hydroxyl groups. From the viewpoint of improved flexibility of a cured body obtained from the composition, it is preferable to use an organosiloxane that contains in one molecule at least two phenolic hydroxyl groups. There are no special restrictions with regard to the amount in which such phenolic hydroxyl groups can be contained in the organosiloxane, but it is recommended that the equivalent amount of phenolic hydroxyl groups (which is a value obtained by dividing the mass average molecular weight of the present component by the number of phenolic hydroxyl groups contained in one molecule) does not exceed 1,000 and for better reactivity, does not exceed 500.

It is preferable that the organosiloxane of component (B) that contains phenolic hydroxyl groups be represented by the following formula:

$$R^6{}_3SiO(R^6{}_2SiO)_n SiR^6{}_3$$

where $R^6$ is an optionally substituted monovalent hydrocarbon group or a monovalent organic group that contains a phenolic hydroxyl group. Furthermore, at least one $R^6$ in one molecule is a monovalent organic group that contains a phenolic hydroxyl group. The aforementioned monovalent hydrocarbon group is exemplified by methyl, ethyl, propyl, butyl, pentyl, hexyl, or similar alkyl groups; cyclopentyl, cyclohexyl, cycloheptyl, or similar cycloalkyl groups; phenyl, tolyl, xylyl, or similar aryl groups; benzyl, phenethyl, phenylpropyl, or similar aralkyl groups; 3-chloropropyl, 3,3,3-trifluoropropyl, or similar halogenated alkyl groups, of which alkyl and aryl groups are preferable, particularly methyl and phenyl groups. Furthermore, the monovalent organic groups that contain phenolic organic groups can be exemplified by the formulas given below, where $R^7$ designates bivalent organic groups such as ethylene, methylethylene, propylene, butylene, pentylene, hexylene, or similar alkylene groups; ethyleneoxyethylene, ethyleneoxypropylene, ethylenoxybutylene, propylenoxypropylene, or similar alkyleneoxyalkylene groups. It is preferable that the above groups be alkylene groups, in particular, propylene groups.

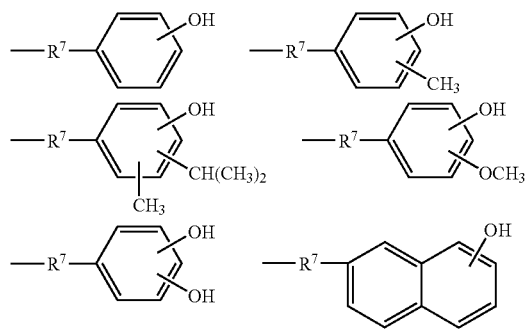

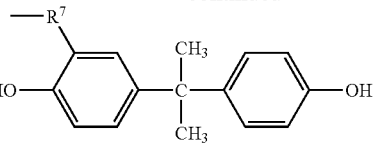

In the above formulas, "n" is an integer in the range of from 0 to 1,000, preferably 0 to 100, and most preferably 0 to 20. If "n" exceeds the recommended upper limit, this will impair compounding with component (A) and handleability.

Aforementioned component (B) is exemplified by organosiloxanes represented by the formulas given below, where "x" is an integer from 1 to 20, and "y" is an integer from 2 to 10.

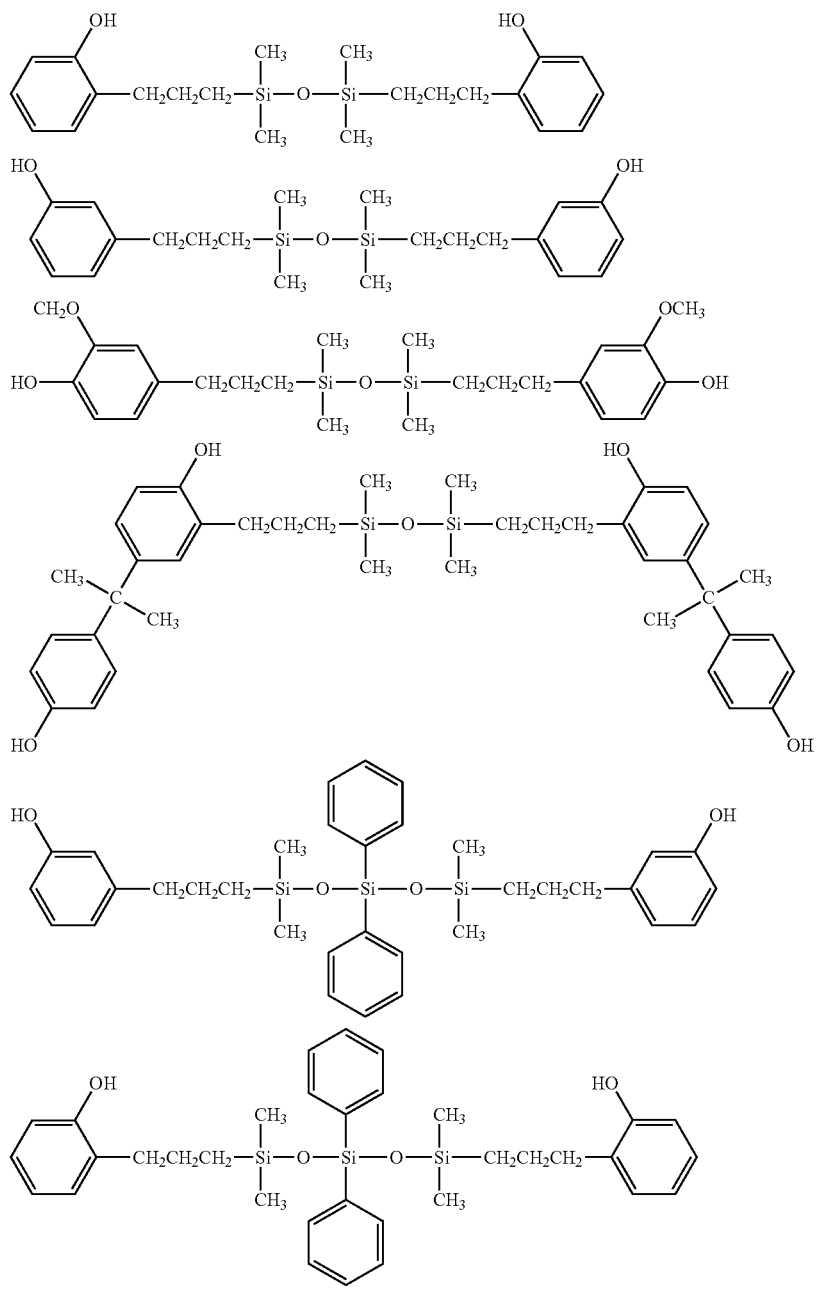

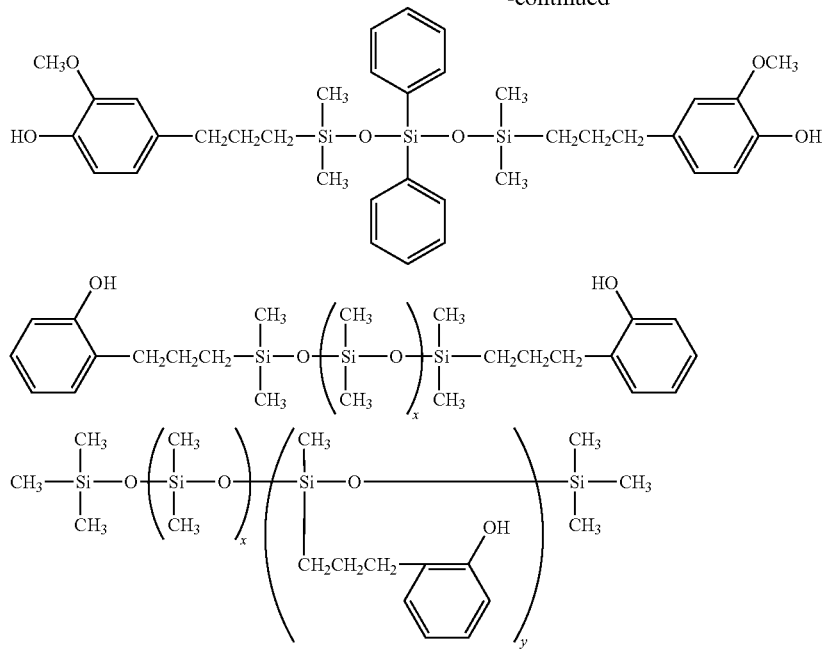

There are no special restrictions with regard to the method that can be used for manufacturing component (B). For example, this component can be obtained by subjecting an alkenyl-containing phenol compound and an organopolysiloxane that has silicon-bonded hydrogen atoms to a hydrosilylation reaction.

There are no special restrictions with regard to the state of component (B) at 25° C., and it can be in a liquid or solid form. The liquid form is preferred from the viewpoint of miscibility with other components and easier handling. It is recommended that the viscosity of component (B) at 25° C. be in the range of 1 to 1,000,000 mPa·s, preferably 10 to 5,000 mPa·s. If the viscosity at 25° C. is below the recommended lower limit, the obtained cured body will have reduced mechanical strength. If, on the other hand, the viscosity exceeds the recommended upper limit, this will impair handleability of the composition.

There are no special restrictions with regard to amounts in which component (B) can be used in the composition, but, in general, it is recommended to use this component in an amount of 0.1 to 500 parts by mass, preferably in the range of 0.1 to 200 parts by mass per 100 parts by mass of component (A). When component (B) contains phenolic hydroxyl groups, it is recommended that the mole ratio of the phenolic hydroxyl groups contained in component (B) to all epoxy groups contained in the composition be in the range of 0.2 to 5, preferably 0.3 to 2.5, and most preferably 0.8 to 1.5. If the mole ratio of the phenolic hydroxyl groups contained in component (B) to all epoxy groups contained in the composition is below the recommended lower limit, it will be difficult to ensure complete curing of the obtained composition. If, on the other hand, the aforementioned ratio exceeds the recommended upper limit, this will impair mechanical properties of the cured body obtained from the composition.

The thermally conductive metal powder that constitutes component (C) is used for imparting thermal conductivity to the cured body obtained from the composition. Component (C) is exemplified by powders of the following metals: gold, silver, copper, nickel, brass, shape-memory alloy, solder, or a similar metal powder. These powders can comprise metal-plated or coated organic or inorganic powders. It is preferable that metal powders of at least one type be selected from gold, silver, copper, or nickel. There are no special restrictions with regard to the shape of the particles that constitute component (C), and the particles may have the shape of crushed particles or irregular, spherical, fiber-like, rod-like, flake-like, scale-like, plate-like, or a coiled shape. To obtain a cured body of high thermal conductivity, it is preferable that component (C) be silver powder, in particular, flake-shaped silver powder. There are no special restrictions with regard to the size of particles of component (C), but generally the maximum size of such particles should not exceed 200 μm and should have an average size of 0.001 to 50 μm.

There are no special restrictions with regard to the amount in which component (C) can be used in the composition. It can be recommended, however, to add component (C) in an amount not exceeding 2,000 parts by mass, specifically in an amount of 10 to 2,000 parts by mass, and preferably 50 to 1,000 parts by mass, per 100 parts by mass of the sum of components (A) and (B). If component (C) is used in an amount smaller than the recommended lower limit, it will be difficult to provide the cured body with high heat-conductive properties. If, on the other hand, component (C) is used in an amount exceeding the recommended upper limit, the obtained composition will be difficult to handle.

Component (D) is a thermally conductive nonmetal powder which is used for imparting heat-conductive properties to the cured body obtained by curing the composition of the invention. When this component is used in combination with component (C), this improves flowability of the obtained composition and reduces specific gravity of the cured body without noticeably reducing heat-conductive properties. Component (D) may be exemplified by alumina, zinc oxide, magnesia, titania, crystalline silica, or a similar metal oxide; aluminum nitride, boron nitride, or a similar metal nitride; silicon carbide, or a similar metal carbide; aluminum hydroxide, magnesium hydroxide, or a similar metal hydroxide; carbon nanotubes, carbon microfibers, diamond, graphite, or similar carbon-system materials. It is preferable that a thermally conductive nonmetal powder of at least one type be selected from the group consisting of metal oxide, metal nitride, and metal carbide, in particular, be selected from the group consisting of alumina, zinc oxide, aluminum nitride, boron nitride, and silicon carbide. Most preferable component (D) is an alumina powder that is readily available and easily miscible with the composition. There are no special restrictions with regard to the shape of the particles of component (D), and the particles may have the shape of crushed particles or irregular, spherical, fiber-like, rod-like, flake-like, scale-like, plate-like, or a coiled shape. For example, the powder may comprise a mixture of irregularly shaped particles and spherical particles. There are no special restrictions with regard to size of the particles, but normally the maximum size of the particles should not exceed 200 μm and should have an average size of 0.001 to 50 μm.

There are no special restrictions with regard to an amount in which component (D) can be added to the composition. In general, however, component (D) can be added in an amount not exceeding 2,000 parts by mass, specifically, 10 to 2,000 parts by mass, and preferably 50 to 1,000 parts by mass, per 100 parts by mass of the sum of components (A) and (B). If component (D) is contained in an amount of less that the recommended lower limit, it will be difficult to impart sufficiently high thermal conductivity to the cured body. On the other hand, if the content of component (D) exceeds the recommended upper limit, the obtained composition will be difficult to handle. It is recommended that the total amount of components (C) and (D) be lower than 2,000 parts by mass, and preferably be in the range of 10 to 2,000 parts by mass per each 100 parts by mass of the sum of components (A) and (B).

If necessary, the composition may contain an arbitrary component such as (E) a curing acceleration agent. Such component (E) may be represented by a tertiary amine compound, an organometallic compound such as organoaluminum compound, an oganozirconium compound, or the like; phosphine, or a similar organophosphorous compound; as well as heterocyclic amin compound, boron complex compound, organic ammonium salt, organic sulfonium salt, organic peroxide, and reaction products of the above compounds. Specific examples of such compounds are the following: triphenylphosphine, tributylphosphine, tri(p-methylphenyl) phosphine, tri(nonylphenyl) phosphine, triphenylphosphine-triphenyborate, tetraphenylphosphine-tetraphenyborate, or similar phosphorous compounds; triethylamine, benzyldimethylamine, α-methylbenzyldimethylamine, 1,8-diazobicyclo[5,4,0]undecene-7, or a similar tertiary amine; 2-methylimidazole, 2-phenyl-4-methylimidazole, or a similar imidazole compound. In order to extend the use time of the composition of the invention, component (E) may comprise a curing-accelerating agent in an encapsulated form. Such an encapsulated curing-accelerating agent, which may comprise an encapsulated amine-type curing accelerator made from a bisphenol-A epoxy resin that contains an amine-type curing accelerating substance, can be purchased from Asahi Kasei Co., Ltd.; trademark HX-3088.

There are no special restrictions with regard to the amount in which component (E) can be added to the composition, but in general it can be recommended that this component be contained in an amount not exceeding 50 parts by mass, in particular, in an amount of 0.01 to 50 parts by mass, and most preferably, 0.1 to 5 parts by mass, per 100 parts by mass of the sum of components (A) and (B). If the content of component (E) in the composition is below the recommended lower limit, this will provide insufficient acceleration of the curing process. If, on the other had, the content of component (E) exceeds the recommended upper limit, this will impair mechanical properties of a body obtained by curing the composition.

In order to further improve curability and handleability of the composition, as well as adhesive properties of the cured body, and to adjust modulus of elasticity of the latter, the composition may be combined with other organic epoxy components. There are no special restrictions with regard to the state of such organic epoxy compounds at 25° C., and they may be liquid or solid, but the liquid state is preferable. Such epoxy organic compounds may be represented by a bisphenol-A epoxy resin, bisphenol-F epoxy resin, and an alicyclic epoxy resin. There are no special restrictions with regard to the amount in which the aforementioned organic epoxy compounds can be used, but in general they should be added in an amount that does not exceed 500 parts by mass, and preferably in the range of 0.1 to 500 parts by mass per 100 parts by mass of the sum of components (A) and (B).

In order to improve adhesive properties of the composition, the composition can be combined with a coupling agent. This coupling agent can be exemplified by a titanate coupling agent, a silane coupling agent, or a similar coupling agent. A titanate coupling agent may comprise i-propoxytitanium tri (i-isostearate). A silane coupling agent may comprise 3-glycidoxypropyl trimethoxysilane, 3-glycidoxypropyl methyldiethoxysilane, 2-(3,4-epoxycyclohexyl) ethyltrimethoxysilane, or a similar epoxy-containing alkoxysilane; N-(2-aminoethyl)-3-aminopropyl trimethoxysilane, 3-aminopropyl triethoxysilane, N-phenyl-3-aminopropyl trimethoxysilane, or a similar amine-containing alkoxysilane; and 3-mercaptopropyl trimethoxysilane, or a similar mercapto-containing alkoxysilane. There are no special restrictions with regard to the amount in which the aforementioned silane coupling agent can be used, but in general it is recommended to add this agent in an amount not exceeding 10 parts by mass, preferably 0.01 to 10 parts by mass per 100 parts by mass of component (A).

The composition of the invention can also be combined with other arbitrary components such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, or octadecyltrimethoxysilane, or a similar silane that contains a long-chain hydrocarbon group, or other alkoxysilanes.

In order to improve mechanical strength of a cured body, the composition may contain a filler, such as fused silica, precipitated silica, fumed silica, baked silica, baked clay, glass beads, talc, calcium carbonate, clay, barium sulfate, beryllium oxide, kaolin, mica, zirconium, or a similar inorganic filler.

In order to reduce viscosity and to improve handleability of the composition and to reduce modulus of elasticity of the cured body, in addition to component (A) and (B), the composition may also include another organosiloxane that contains epoxy or phenolic hydroxyl groups and reactive functional groups. Such functional groups may comprise epoxy-reactive primary amine groups, secondary amine groups, hydroxyl groups, phenolic hydroxyl groups, carboxylic acid groups, acid-anhydride groups, mercapto groups, or silanol groups. From the viewpoint of better reactivity and pot life, the use of phenolic hydroxyl groups is preferable. When component (B) contains phenolic hydroxyl groups, it is recommended that the functional groups thereof comprise epoxy groups. It is recommended that such other organosiloxanes have a functional-group equivalent greater than that of component (B) and molecular weight and viscosity lower than those of component (A). Such organosiloxanes can be exemplified by a polyorganosiloxane having a glycidoxypropyl group only on one molecular terminal, a polyorganosiloxane having glycidoxypropyl groups on both molecular terminals, a polyorganosiloxane having a phenolic hydroxyl group only on one molecular terminal, or a polyorganosiloxane represented by the following general formula:

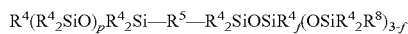

(where $R^4$ is an optionally substituted monovalent hydrocarbon group that is free of unsaturated aliphatic bonds; $R^5$ is a bivalent organic group; $R^8$ is a monovalent hydrocarbon group that contains phenolic hydroxyl groups; "f" is 0 or 1; and "p" is an integer ranging from 1 to 400). The optionally substituted monovalent hydrocarbon group that is free of unsaturated aliphatic bonds and is designated in the above formula by $R^4$ may be the same as exemplified above. It is preferable that the group designated by $R^4$ be an alkyl group, in particular, a methyl group. The bivalent organic group designated in the above formula by $R^5$ may be the same group as exemplified above. It is preferable that the group designated by $R^5$ be an alkylene group, in particular, ethylene group. Furthermore, the monovalent hydrocarbon group that contains phenolic hydroxyl groups and is designated in the above formula by $R^8$ may be the same group as the hydrocarbon group that contains phenolic hydroxyl group and was earlier designated by $R^6$. In the above formula, "f" is 0 or 1; "p" is an integer ranging from 1 to 400, preferably 1 to 100, and most preferably 1 to 50. The aforementioned polyorganosiloxane that contains a phenolic hydroxyl group may comprise a dimethylpolysiloxane of the following formula:

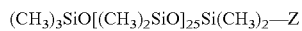

where Z is represented by the following formula:

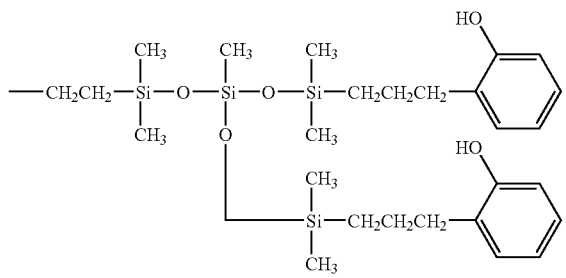

or a dimethylpolysiloxane of the following formula:

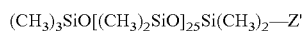

where Z' is represented by the following formula:

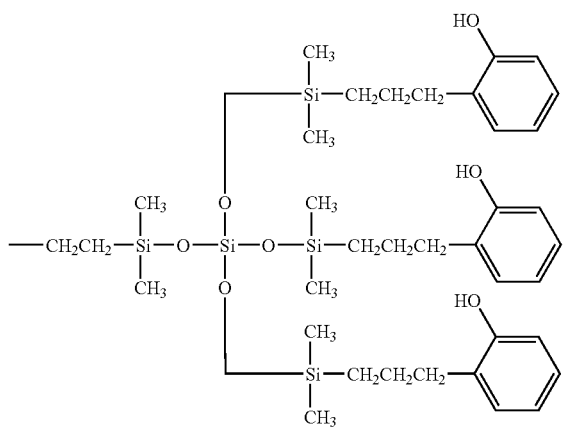

There are no special restrictions with regard to the amount in which the aforementioned organosiloxane that contains epoxy groups or phenolic hydroxyl groups and reactive functional groups can be used, but in general it is recommended to use such an organosiloxane in an amount not exceeding 500 parts by mass, preferably in the range of 0.1 to 500 parts by mass per 100 parts by mass of the sum of components (A) and (B).

In order to reduce viscosity and improve handleability of the composition, the latter can be combined with a solvent. There are no special restrictions with regard to the type of a solvent, provided that it dissolves components (A) and (B), but preferably the solvent should have low molecular weight and possess volatility. Such a solvent can be represented by hexane, heptane, or a similar aliphatic hydrocarbon; toluene, xylene, or a similar aromatic hydrocarbon; and acetone, methylethylketone, or a similar ketone. There are no special restrictions with regard to the amount in which the solvent can be added to the composition, but in order to improve workability of the composition, the solvent should be added in an amount not exceeding 100 parts by mass per 100 parts by mass of the sum of components (A) and (B).

The composition of the invention is prepared by mixing the components (A) to (D), if necessary, with an addition of the arbitrary components. There are no special restrictions with regard to a method used for the preparation of the composition. For example, all the components can be mixed simultaneously, or components (C) and (D) can be added after premixing components (A) and (B), if necessary, with the arbitrary components. Also, there are no limitations with regard to equipment that can be used for mixing. For example, this can be a single-shaft-type or a two-shaft-type continuous mixer, a two-roll mill, a Ross mixer, a Hobart mixer, a dental mixer, a planetary mixer, or a kneader mixer.

The composition of the invention is suitable for transfer molding, injection molding, potting, casting, powder application, application by dipping, dripping, etc. Methods of use can be selected from potting, dispensing, screen printing, coating, etc. In order to facilitate the use of the composition in small quantities, a liquid or paste-like state is preferable. Since curing of the composition forms a heat-conductive cured body that is characterized by excellent flexibility and high adhesive properties, the composition can be used as a sealing substance, a cast-molding composition, a coating composition, a heat-radiating composition, etc. In particular, for removal of heat, the composition can be used as a thermal interface material (TIM).

The following is a detailed description of an electronic component of the present invention. The electronic component of the invention is characterized by the fact that it is sealed and bonded with the use of a cured body of the composition of the invention. Such a component may comprise a diode, transistor, thyristor, monolithic IC, hybrid IC, LSI, or VLSI. Examples of semiconductor elements of the invention are semiconductor elements used in diodes, transistors, thyristors, monolithic ICs, or hybrid ICs.

FIG. 1 is a cross-sectional view of an LSI shown as an example of an electronic component of the invention. An electronic component shown in this drawing uses a cured body of the curable silicone composition of the invention as a heat-radiation material, in particular, as a thermal transfer material (TIM). The electronic component of FIG. 1 consists of a semiconductor element 1 electrically connected to a circuit-carrying substrate 2 via solder bumps, e.g., ball-grid array 3 provided on the aforementioned semiconductor element. The substrate 2 can be made from a glass-fiber-reinforced epoxy resin, Bakelite resin, phenolic resin, or a similar resin; alumina, or a similar ceramics; and copper, aluminum, or a similar metal. Semiconductor elements other than element 1 that can be installed on the substrate are resistors, capacitors, coils, etc. Shown in FIG. 1 between the semiconductor element 1 and the substrate 2 is an underfiller material. However, the use of an underfiller material is optional.

Installed between the semiconductor element 1 and a heat spreader 4 is a thermal-transfer material 5, and the heat spreader 4 is connected to a heat sink 6 via a thermal-transfer material 7. The heat spreader 4 and the heat sink 6 can be made from aluminum, copper, nickel, or a similar metal. The electronic component shown in FIG. 1 is characterized by the fact that the thermal-transfer materials 5 and/or 7 thereof comprise cured bodies of the curable silicone composition of the invention. The cured bodies of the curable silicone composition of the invention may be used either for bonding the semiconductor element 1 to the heat spreader 4 or for bonding the heat spreader 4 to the heat sink 6. For convenience of maintenance, it is recommended that the thermal-transfer material used in the electronic device of the invention comprise a heat-conductive grease, or the like.

There are no special restrictions with regard to the method of manufacturing the electronic component of the invention. For example, the following method can be used for manufacturing the electronic component of FIG. 1. First a semiconductor element 1 is installed on the substrate 2, and the semiconductor element 1 is electrically connected to the substrate by means of the ball-grid array 3. Following this, an underfiller material is introduced if necessary. At the next step, the surface of the semiconductor element 1 is coated with a thermally conductive curable silicone composition, a heat spreader 4 is installed, and the curable silicone composition is cured. Next, the heat spreader 4 is coated with the thermally conductive curable silicone composition or the thermally conductive grease, and the heat sink 6 is installed. If the coating is made from the curable silicone composition, the latter is cured.

EXAMPLES

The curable silicone composition and the electronic component of the present invention will now be described in more details with reference to application and comparative examples. The characteristics of the curable silicone composition and the cured body produced therefrom were measured by the methods described below. In the subsequent examples, mass-average molecular weight is a polystyrene-referenced mass-average molecular weight determined by gel-permeation chromatography with use of toluene as a solvent.

[Viscosity]

Viscosity of the curable silicone composition at 25° C. was determined by using an E-type viscometer (the product of TOKIMEC Co., Ltd., Digital Viscometer DV-U-E, Type II; 2.5 rpm).

[Composite Modulus of Elasticity]

A curable silicone composition was defoamed at 70 mmHg, poured into a mold having a cavity with the following dimensions: length 50 mm×width 10 mm×depth 2 mm, subjected to compression curing for 60 min. under conditions of 130° C. and 2.5 MPa, and then to secondary heat treatment for 3 hours in an oven at 150° C., whereby a cured specimen was produced. This specimen was used for determining flexibility of the cured body by measuring a composite modulus of elasticity at 25° C. with the use of the ARES rheometer (instrument for measuring viscoelasticity, the product of Rheometric Scientific Co., Inc., Model RDA700). Measurement was carried out at 1 Hz frequency and 0.5% twist.

[Thermal Resistance and Thermal Conductivity]

A curable silicone composition was sandwiched between a pair of silicon chips so that the composition formed a 50 μm-thick layer, and the composition was then cured by heating the assembly for 1 hours at 130° C. in a hot-air-circulation oven. Following this, the product was subjected to post-curing for 3 hours at 150° C. in a hot-air-circulation oven. As a result, a thermal-resistance-measurement specimen was produced. Thermal resistance and coefficient of thermal conductivity of a cured body were determined by measuring these characteristics on the aforementioned specimen with the use of a thermal-resistance measurement instrument of Hitachi Seisakusho Co., Ltd.

Practical Example 1

A curable silicone composition was prepared by mixing the following components:

5.0 parts by mass of a dimethylpolysiloxane (mass-average molecular weight=47,900; viscosity=7,400 mPa·s; epoxy equivalent=580) represented by the following formula:

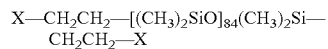

{in the above formula, X is a siloxane residue represented by the following average unit formula:

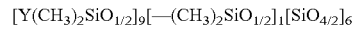

(where Y represents 3-glycidoxypropyl group and 3-trimethoxysilylpropyl group in a ratio of 6:4)};

2.0 parts by mass of an organotrisiloxane (viscosity=2,600 mPa·s; phenolic-hydroxyl-group equivalent=330) represented by the following formula:

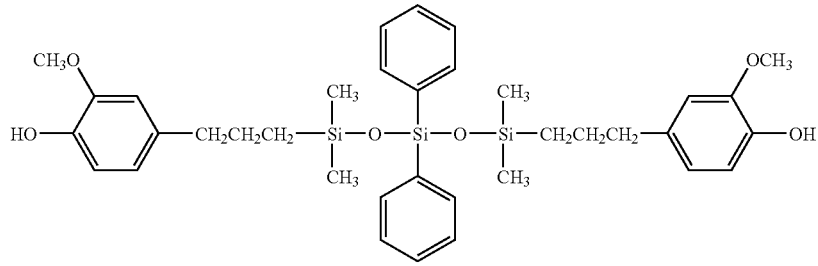

1.0 part by mass of a mixture of bisphenol-F epoxy resin and a bisphenol-A epoxy resin of a 35 mass % encapsulated amine catalyst (HX-3941HP; the product of Asahi Kasei Co., Ltd.);

29.7 parts by mass of a flake-like silver powder (the product of Fukuda Metal Foil Powder Co., Ltd.; 50% average grain size=not exceeding 9 μm; tap density=4.2 to 5.4 g/cm³; and apparent density=2.7 to 3.4 g/cm³);

46.7 parts by mass of a spherical alumina powder with an average grain size of 8.6 μm;

12.7 parts by mass of an irregular alumina powder with an average grain size of 3 μm; and 3.0 parts by mass of a dimethylpolysiloxane (mass-average molecular weight=2,500; viscosity=75 mPa·s;) represented by the following formula:

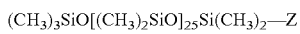

(where Z is represented by the following formula:

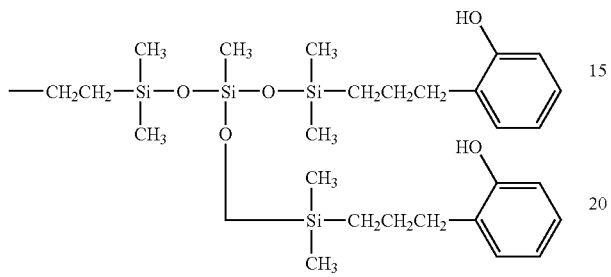

The following characteristics of the obtained curable silicone composition were measured: viscosity, specific gravity of a cured body, composite modulus of elasticity, thermal resistance, and a coefficient of thermal conductivity. The results of measurements are shown in Table 1.

Practical Example 2

A curable silicone composition was prepared by mixing the following components:

3.0 parts by mass of a dimethylpolysiloxane (mass-average molecular weight=47,900; viscosity=7,400 mPa·s; epoxy equivalent=580) represented by the following formula:

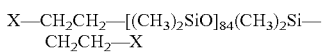

{in the above formula, X is a siloxane residue represented by the following average unit formula:

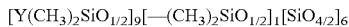

(where Y represents 3-glycidoxypropyl group and 3-trimethoxysilylpropyl group in a ratio of 6:4)};

1.0 parts by mass of an organotrisiloxane (viscosity=2,600 mPa·s; phenolic-hydroxyl-group equivalent=330) represented by the following formula:

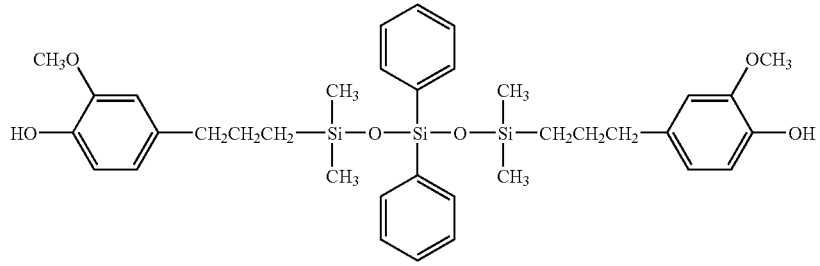

1.0 part by mass of a mixture of bisphenol-F epoxy resin and a bisphenol-A epoxy resin of a 35 mass % encapsulated amine catalyst (HX-3941HP; the product of Asahi Kasei Co., Ltd.);

28.7 parts by mass of a flake-like silver powder (the product of Fukuda Metal Foil Powder Co., Ltd.; 50% average grain size=not exceeding 9 μm; tap density=4.2 to 5.4 g/cm$^3$; and apparent density=2.7 to 3.4 g/cm$^3$);

49.0 parts by mass of a spherical alumina powder with an average grain size of 8.6 μm;

13.4 parts by mass of an irregular alumina powder with an average grain size of 3 μm; and 3.0 parts by mass of a dimethylpolysiloxane (mass-average molecular weight=2,500; viscosity=75 mPa·s;) represented by the following formula:

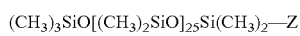

(where Z is represented by the following formula:

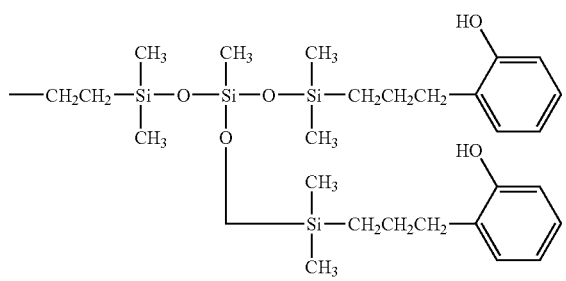

The following characteristics of the obtained curable silicone composition were measured: viscosity, specific gravity of a cured body, composite modulus of elasticity, thermal resistance, and coefficient of thermal conductivity. The results of measurements are shown in Table 1.

Comparative Example 1

A curable silicone composition was prepared by mixing the following components:

4.2 parts by mass of a dimethylpolysiloxane (mass-average molecular weight=47,900; viscosity=7,400 mPa·s; epoxy equivalent=580) represented by the following formula:

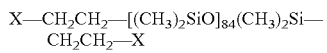

{in the above formula, X is a siloxane residue represented by the following average unit formula:

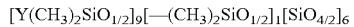

(where Y represents 3-glycidoxypropyl group and 3-trimethoxysilylpropyl group in a ratio of 6:4)};

1.0 parts by mass of an organotrisiloxane (viscosity=2,600 mPa·s; phenolic-hydroxyl-group equivalent=330) represented by the following formula:

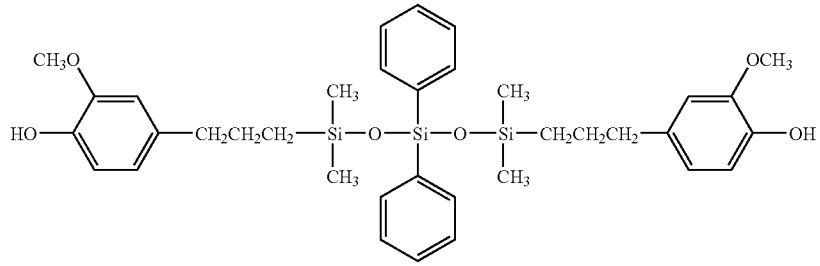

1.0 part by mass of a mixture of bisphenol-F epoxy resin and a bisphenol-A epoxy resin of a 35 mass % encapsulated amine catalyst (HX-3941HP; the product of Asahi Kasei Co., Ltd.);

90.0 parts by mass of a flake-like silver powder (the product of Fukuda Metal Foil Powder Co., Ltd.; 50% average grain size=not exceeding 9 μm; tap density=4.2 to 5.4 g/cm$^3$; and apparent density=2.7 to 3.4 g/cm$^3$); and 3.6 parts by mass of a dimethylpolysiloxane (mass-average molecular weight=2,500; viscosity=75 mPa·s;) represented by the following formula:

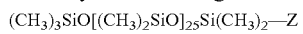

(where Z is represented by the following formula:

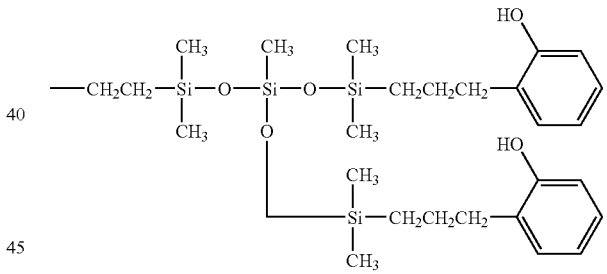

The following characteristics of the obtained curable silicone composition were measured: viscosity, specific gravity of a cured body, composite modulus of elasticity, thermal resistance, and coefficient of thermal conductivity. The results of measurements are shown in Table 1.

Comparative Example 2

A curable silicone composition was prepared by mixing the following components:

13.0 parts by mass of a dimethylpolysiloxane (mass-average molecular weight=47,900; viscosity=7,400 mPa·s; epoxy equivalent=580) represented by the following formula:

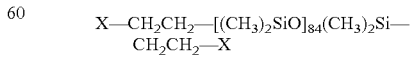

{in the above formula, X is a siloxane residue represented by the following average unit formula:

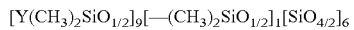

(where Y represents 3-glycidoxypropyl group and 3-trimethoxysilylpropyl group in a ratio of 6:4)};

5.0 parts by mass of an organotrisiloxane (viscosity=2,600 mPa·s; phenolic-hydroxyl-group equivalent=330) represented by the following formula:

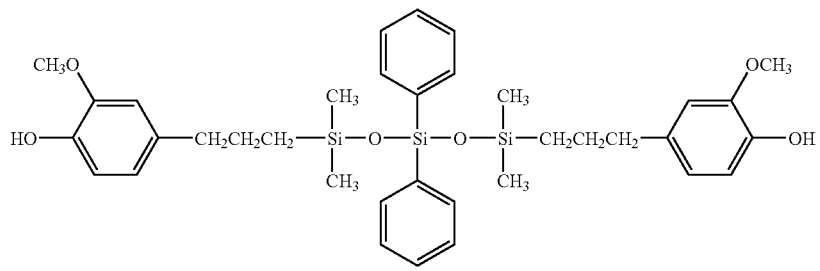

1.0 part by mass of a mixture of bisphenol-F epoxy resin and a bisphenol-A epoxy resin of a 35 mass % encapsulated amine catalyst (HX-3941HP; the product of Asahi Kasei Co., Ltd.);

60.8 parts by mass of a spherical alumina powder having an average grain size of 8.6 μm;

16.6 parts by mass of irregular alumina powder having an average grain size of 3 μm; and 3.6 parts by mass of a dimethylpolysiloxane (mass-average molecular weight=2,500; viscosity=75 mPa·s;) represented by the following formula:

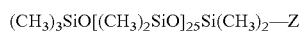

(CH$_3$)$_3$SiO[(CH$_3$)$_2$SiO]$_{25}$Si(CH$_3$)$_2$—Z (where Z is represented by the following formula:

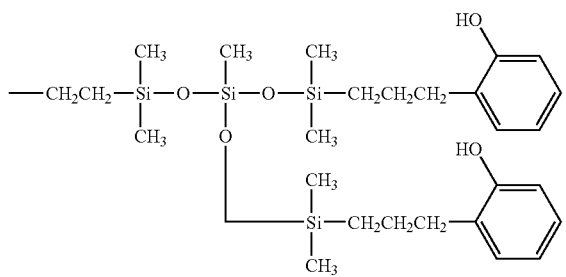

The following characteristics of the obtained curable silicone composition were measured: viscosity, specific gravity of a cured body, composite modulus of elasticity, thermal resistance, and coefficient of thermal conductivity. The results of measurements are shown in Table 1.

INDUSTRIAL APPLICABILITY

The curable silicone composition of the invention is suitable for transfer molding, injection molding, potting, casting, powder application, application by dipping, dripping, etc. Since curing of the composition forms a heat-conductive cured body that is characterized by excellent flexibility and high adhesive properties, the composition can be used as a sealing composition, a cast-molding composition, a coating composition, a heat-radiating composition, etc. In particular, for removal of heat, the composition can be used as a thermal interface material (TIM).

The invention claimed is:

1. A curable silicone composition comprising at least the following components: (A) an epoxy-containing organopolysiloxane component comprising (A$_2$) an epoxy-containing organopolysiloxane represented by the following general formula:

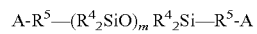

A-R$^5$—(R$^4{}_2$SiO)$_m$R$^4{}_2$Si—R$^5$-A where R$^4$ represents an optionally substituted monovalent hydrocarbon group that is free of unsaturated aliphatic bonds, R$^5$ is a bivalent organic group, and where A is an organopolysiloxane residue represented by the following average unit formula:

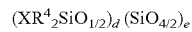

(XR$^4{}_2$SiO$_{1/2}$)$_d$(SiO$_{4/2}$)$_e$ where R$^4$ is the same as defined above; and X designates a single bond, a hydrogen atom, a group represented by R$^4$ as defined above, an epoxy-containing monovalent organic group, or an alkoxysilylalkyl group; however, at

TABLE 1

|  | Examples | | | |
|  | Present Invention | | Comparative Examples | |
| Properties | Appl. Ex. 1 | Appl. Ex. 2 | Comp. Ex. 1 | Comp. Ex. 2 |
| Curable silicone composition | | | | |
| Viscosity (Pa · s) | 380 | 320 | 80 | 190 |
| Cured body | | | | |
| Specific gravity | 2.8 | 3.4 | 5.4 | 2.0 |
| Composite modulus of elasticity (MPa) | 770 | 780 | 300 | 35 |
| Thermal resistance (cm$^2$ · °C./W) | 0.28 | 0.18 | 0.13 | 0.85 |
| Thermal conductivity (W/m · K) | 2.11 | 3.84 | 5.70 | 1.10 | least one X is a single bond, and at least one X is an epoxy-containing monovalent organic group; "d" is a positive number; "e" is a positive number; and "d/e" is a positive number from 0.2 to 4; and "m" is an integer equal to or greater than 1; (B) a curing agent for an epoxy resin; (C) a thermally conductive metal powder; and (D) a thermally conductive nonmetal powder, wherein the thermally conductive metal powder is contained in an amount of 10 to 2,000 parts by mass per 100 parts by mass of the sum of components (A) and (B), wherein component (B) is an organosiloxane represented by the following general formula:

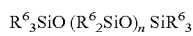

where $R^6$ is an optionally substituted monovalent hydrocarbon group or a monovalent organic group selected from the group consisting of:

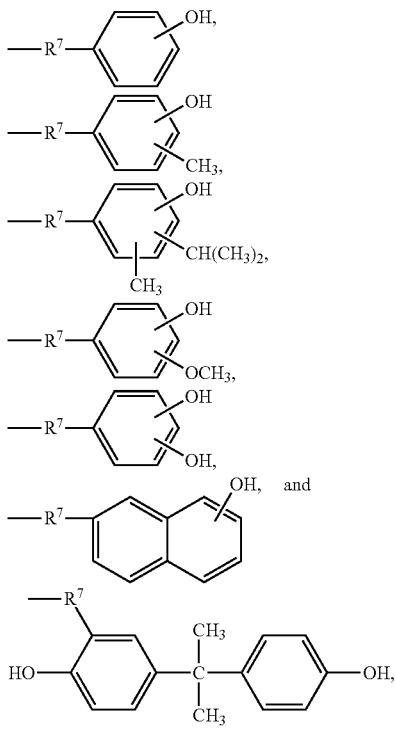

wherein $R^7$ designates alkylene or alkylenoxyalkylene groups, wherein at least two groups represented by $R^6$ contained in one molecule are the aforementioned monovalent organic groups and with the proviso that at least one $R^6$ at each molecular terminal of component (B) is the aforementioned monovalent organic group, and wherein "n" is an integer from 0 to 1,000.

2. The curable silicone composition of claim 1, wherein component (A) further comprises ($A_1$) an epoxy-containing organopolysiloxane represented by the following average unit formula:

where $R^1$, $R^2$, and $R^3$ are the same or different and comprise optionally substituted monovalent hydrocarbon groups or epoxy-containing monovalent organic groups; however, at least two groups should be the aforementioned epoxy-containing monovalent organic groups; at least 20mole % of all groups represented by $R^3$ are aryl groups; and "a", "b", and "c" are numbers which satisfy the following conditions:
$0 \leq a \leq 0.8$; $0 \leq b \leq 0.8$; $0.2 \leq c \leq 0.9$; $a+b+c=1$.

3. The curable silicone composition of claim 1, wherein component (B) is contained in an amount of 0.1 to 500 parts by mass per 100 parts by mass of component (A).

4. The curable silicone composition of claim 1, wherein component (C) is a thermally conductive metal powder of at least one type selected from the group consisting of gold, silver, copper, and nickel.

5. The curable silicone composition of claim 1, wherein component (D) is a thermally conductive nonmetal powder of at least one type selected from the group consisting of metal oxide, metal nitride, and metal carbide.

6. The curable silicone composition of claim 1, wherein component (D) is a thermally conductive nonmetal powder of at least one type selected from the group consisting of alumina, zinc oxide, aluminum nitride, boron nitride, and silicon carbide.

7. The curable silicone composition of claim 1, wherein component (D) is contained in an amount of 10 to 2,000 parts by mass per 100 parts by mass of the sum of components (A) and (B).

8. The curable silicone composition of claim 1, further comprising (E) a curing accelerator.

9. The curable silicone composition of claim 8, wherein component (E) is an encapsulated amine-type curing accelerator.

10. The curable silicone composition of claim 8, wherein component (E) is contained in an amount of 0.01 to 50 parts by mass per 100 parts by mass of the sum of components (A) and (B).

11. An electronic device sealed or adhesively bonded with use of a cured body obtained by curing a curable silicone composition according to claim 1.

* * * * *